(12) United States Patent
Ngai et al.

(10) Patent No.: US 10,886,612 B2
(45) Date of Patent: Jan. 5, 2021

(54) BI-DIRECTIONAL ACTIVE PHASE SHIFTING

(71) Applicant: Qualcomm Incorporated, San Diego, CA (US)

(72) Inventors: Wai Lim Ngai, Poway, CA (US); Jeremy Dunworth, La Jolla, CA (US)

(73) Assignee: QUALCOMM Incorporated, San Diego, CA (US)

( * ) Notice: Subject to any disclaimer, the term of this patent is extended or adjusted under 35 U.S.C. 154(b) by 50 days.

(21) Appl. No.: 16/133,566

(22) Filed: Sep. 17, 2018

(65) Prior Publication Data
US 2020/0091605 A1     Mar. 19, 2020

(51) Int. Cl.
*H01Q 3/34*     (2006.01)
*H04B 7/0404*   (2017.01)
*H04B 1/48*     (2006.01)

(52) U.S. Cl.
CPC .............. *H01Q 3/34* (2013.01); *H04B 1/48* (2013.01); *H04B 7/0404* (2013.01)

(58) Field of Classification Search
CPC .......... H01Q 3/34; H04B 7/0404; H04B 1/48; H04B 7/084; H04B 7/0617
See application file for complete search history.

(56) References Cited

U.S. PATENT DOCUMENTS

| | | | |
|---|---|---|---|
| 4,458,219 A * | 7/1984 | Vorhaus | H01P 1/184 333/161 |
| 4,599,585 A * | 7/1986 | Vorhaus | H01P 1/185 333/139 |
| 4,635,062 A * | 1/1987 | Bierig | H01Q 3/36 333/103 |
| 4,713,557 A | 12/1987 | Carter et al. | |
| 5,027,084 A | 6/1991 | Tsukii et al. | |
| 5,105,166 A * | 4/1992 | Tsukii | H03F 3/607 330/277 |
| 5,801,600 A * | 9/1998 | Butland | H01Q 3/32 333/127 |
| 5,821,813 A | 10/1998 | Batchelor et al. | |
| 6,470,054 B1 | 10/2002 | Boudry et al. | |
| 6,636,085 B2 | 10/2003 | Okazaki et al. | |
| 6,894,657 B2 | 5/2005 | Carey | |
| 7,239,852 B2 | 7/2007 | Yang et al. | |
| 7,256,649 B2 | 8/2007 | Ksienski et al. | |
| 7,312,763 B2 * | 12/2007 | Mohamadi | H01Q 3/2652 333/103 |
| 7,535,409 B1 | 5/2009 | Choe et al. | |
| 7,773,959 B1 | 8/2010 | Bachhuber et al. | |

(Continued)

OTHER PUBLICATIONS

El-Khatib et al, Fully-Integrated Tunable Linearized CMOS Active Analog Phase Shifter with Active Low Compensation for Multiple Antenna Wireless Transceiver Applications, 2009, IEEE, pp. 2966-2969 (Year: 2009).*

(Continued)

*Primary Examiner* — Lewis G West
(74) *Attorney, Agent, or Firm* — Colby Nipper/Qualcomm

(57) ABSTRACT

An apparatus is disclosed for bi-directional active phase shifting. In an example aspect, the apparatus includes a wireless transceiver. The wireless transceiver includes at least one transmit path and at least one receive path. The wireless transceiver also includes at least one active phase shifter disposed in both the transmit path and the receive path.

30 Claims, 6 Drawing Sheets

(56) References Cited

U.S. PATENT DOCUMENTS

| | | | |
|---|---|---|---|
| 8,208,869 B2* | 6/2012 | Jeong | H03F 1/22 455/73 |
| 8,319,569 B2 | 11/2012 | Kojima | |
| 9,054,792 B2 | 6/2015 | Wu et al. | |
| 9,094,102 B2 | 7/2015 | Corman et al. | |
| 9,362,871 B2 | 6/2016 | Qureshi | |
| 9,473,195 B2* | 10/2016 | Zhan | H01Q 3/30 |
| 9,577,600 B2 | 2/2017 | Natarajan et al. | |
| 9,837,966 B1 | 12/2017 | Ahmed et al. | |
| 10,784,636 B1 | 9/2020 | Vigilante et al. | |
| 2003/0227353 A1* | 12/2003 | Fayyaz | H01P 1/185 333/161 |
| 2009/0146764 A1 | 6/2009 | Chen | |
| 2011/0018626 A1 | 1/2011 | Kojima et al. | |
| 2012/0098698 A1* | 4/2012 | Reuter | G01S 7/03 342/200 |
| 2014/0128009 A1 | 5/2014 | Yeh et al. | |
| 2014/0154981 A1 | 6/2014 | Nakatani | |
| 2014/0155003 A1 | 6/2014 | Nakatani | |
| 2014/0287704 A1* | 9/2014 | Dupuy | H01Q 3/24 455/114.2 |
| 2016/0226142 A1* | 8/2016 | Leroux | H01Q 3/38 |
| 2016/0380754 A1* | 12/2016 | Chen | H04L 7/033 455/76 |
| 2017/0338854 A1* | 11/2017 | Perumana | H04B 1/56 |
| 2018/0019719 A1 | 1/2018 | Roderick et al. | |
| 2018/0309464 A1* | 10/2018 | Mandegaran | H04B 1/52 |
| 2018/0309502 A1 | 10/2018 | Khandani | |
| 2020/0021024 A1* | 1/2020 | Park | H04B 7/08 |

OTHER PUBLICATIONS

Ameen, et al., "A 28 GHz Four-Channel Phased-Array Transceiver in 65-nm CMOS Technology for 5G Applications", 2017 29th International Conference on Microelectronics (ICM), May 21, 2018, 4 pages.

Cetindogan, et al., "A 6-Bit Vector-Sum Phase Shifter with a Decoder Based Control Circuit for X-Band Phased-Arrays", IEEE Microwave and Wireless Components Letters (vol. 26, Issue: 1, Jan. 2016), Jan. 2016, 3 pages.

Cohen, et al., "A CMOS Bidirectional 32-Element Phased-Array Transceiver at 60 GHz With LTCC Antenna", IEEE Transactions on Microwave Theory and Techniques; Year: 2013, vol. 61, Issue: 3; pp. 1359-1375, Mar. 2013, 17 pages.

Greene, et al., "A 60-GHz Dual-Vector Doherty Beamformer", IEEE Journal of Solid-State Circuits, vol. 52, No. 5, May 2017, 2017, 15 pages.

Hu, et al., "A 28GHz/37GHz/39GHz Multiband Linear Doherty Power Amplifier for 5G Massive MIMO Applications", ISSCC 2017 / Session 2 / Power Amplifiers / 2.1, May 21, 2018, 3 pages.

Hu, et al., "A Broadband Mixed-Signal CMOS Power Amplifier With a Hybrid Class-G Doherty Efficiency Enhancement Technique", IEEE Journal of Solid-State Circuits, vol. 51, No. 3, Mar. 2016, May 21, 2018, 16 pages.

Kibaroglu, et al., "An Ultra Low-Cost 32-Element 28 GHz Phased-Array Transceiver with 41 dBm EIRP and 1.0-1.6 Gbps 16-QAM Link at 300 Meters", RM01A-4 UIniversity of California, San Diego, La Jolla, CA, USA, May 21, 2018, 4 pages.

Kim, et al., IEEE Microwave and Guided Wave Letters, vol. 10, No. 6, Jun. 2000, Jun. 2000, 3 pages.

Kim, et al., "An Improved Wideband All-Pass I/Q Network for Millimeter-Wave Phase Shifters", IEEE Transactions on Microwave Theory and Techniques, vol. 60, No. 11, Nov. 2012, Nov. 2012, 9 pages.

Sah, et al., "Design and Analysis of a Wideband 15-35-GHz Quadrature Phase Shifter With Inductive Loading", Transactions on Microwave Theory and Techniques, vol. 61, No. 8, Aug. 2013, Aug. 2013, 10 pages.

Shahramian, et al., "A 70-100 GHz Direct-Conversion Transmitter and Receiver Phased Array Chipset Demonstrating 10 Gb/s Wireless Link", IEEE Journal of Solid-State Circuits; Year: 2013, vol. 48, Issue: 5; pp. 1113-1125, May 2013, 13 pages.

Shahramian, et al., "A Fully Integrated Scalable W-Band Phased-Array Module with Integrated Antennas, Self-Alignment and Self-Test", ISSCC 2018 / Session 4 / mm-Wave Radios for 5G and Beyond / 4.6, May 21, 2018, 3 pages.

Shimura, et al., "Low Power Consumption Vector-Sum Phase Shifters using Zero-Pi Amplifiers for Millimeter-Wave Beamforming", European Microwave Conference (EuMC), 2017 47th. IEEE, 2017, 2017, 4 pages.

Sowlati, et al., "A 60GHz 144-Element Phased-Array Transceiver with 51dBm Maximum EIRP and ±60° Beam Steering for Backhaul Application", ISSCC 2018 / Session 4 / mm-Wave Radios for 5G and Beyond / 4.2, May 21, 2018, 3 pages.

Valdes-Garcia, et al., "A Fully Integrated 16-Element Phased-Array Transmitter in SiGe BiCMOS for 60-GHz Communications," IEEE Journal of Solid-State Circuits, vol. 45, No. 12, Dec. 2010, pp. 2757-2773.

* cited by examiner

600

```
┌─────────────────────────────────────────┐
│  Accept an input transmit signal at a shared  │
│  node of an active phase shifter at a first time  │
│                    602                   │
└─────────────────────────────────────────┘
                    │
                    ▼
┌─────────────────────────────────────────┐
│  Generate, based on the input transmit signal, a  │
│  phase-shifted transmit signal at a transmit node │
│  of the active phase shifter at the first time    │
│                    604                   │
└─────────────────────────────────────────┘
                    │
                    ▼
┌─────────────────────────────────────────┐
│  Accept an input receive signal at a receive node │
│  of the active phase shifter at a second time     │
│                    606                   │
└─────────────────────────────────────────┘
                    │
                    ▼
┌─────────────────────────────────────────┐
│  Generate, based on the input receive signal, a   │
│  phase-shifted receive signal at the shared node  │
│  of the active phase shifter at the second time   │
│                    608                   │
└─────────────────────────────────────────┘
```

BI-DIRECTIONAL ACTIVE PHASE SHIFTING

TECHNICAL FIELD

This disclosure relates generally to wireless transceivers and, more specifically, to techniques for implementing a bi-directional active phase shifter.

BACKGROUND

Electronic devices use radio-frequency (RF) signals to communicate information. These radio-frequency signals enable users to talk with friends, download information, share pictures, remotely control household devices, receive global positioning information, employ radar for object detection and tracking, listen to radio stations, and so forth. Over longer distances, it may be challenging to distinguish the radio-frequency signals from background noise. To address this issue, some electronic devices use phase shifters for beamsteering. Beamsteering enables the electronic device to increase signal strength or sensitivity in a particular spatial direction. In this way, the electronic device can communicate with other devices over farther distances.

To improve spatial coverage or to support multiple frequency bands, it may be desirable to increase a quantity of antenna elements within one or more antenna arrays of the electronic device. As the quantity of antenna elements, increases, however, a quantity of phase shifters used for beamsteering may also increase. It can be challenging to design a phase shifter that conserves space within the electronic device without introducing additional losses to the signals being transmitted or received. Consequently, employing some phase shifter designs may limit an electronic device's spatial diversity or frequency diversity capabilities by limiting the quantity of phase shifters that can be implemented within a housing of the electronic device.

SUMMARY

An apparatus is disclosed that implements bi-directional active phase shifting. The described techniques implement an active phase shifter that is bi-directional and disposed in both a transmit path and a receive path. The active phase shifter includes a quadrature coupling circuit that enables phase shifting operations to be performed for either transmission or reception. By sharing the quadrature coupling circuit with both the transmit path and the receive path, the active phase shifter occupies less space compared to other designs that have individual active phase shifters disposed in the transmit and receive paths. The active phase shifter can also include variable gain amplifiers, which enable the active phase shifter to achieve higher accuracies relative to some passive phase shifters and to support wideband communications, such as those used for fifth-generation (5G) or millimeter-wave communication modes. Use of the variable gain amplifiers can further conserve space within a wireless transceiver by obviating the use of additional gain buffers used in other wireless transceiver architectures with passive phase shifters.

In an example aspect, an apparatus is disclosed. The apparatus includes a wireless transceiver. The wireless transceiver includes at least one transmit path and at least one receive path. The wireless transceiver also includes at least one active phase shifter disposed in both the transmit path and the receive path.

In an example aspect, an apparatus is disclosed. The apparatus includes a wireless transceiver. The wireless transceiver includes at least one transmit path and at least one receive path. The wireless transceiver also includes active means for phase shifting signals propagating along the transmit path and the receive path at different times.

In an example aspect, a method for bi-directional active phase shifting is disclosed. The method includes accepting an input transmit signal at a shared node of an active phase shifter at a first time. The method also includes generating, based on the input transmit signal, a phase-shifted transmit signal at a transmit node of the active phase shifter at the first time. At a second time, the method includes accepting an input receive signal at a receive node of the active phase shifter. The method also includes generating, based on the input receive signal, a phase-shifted receive signal at the shared node of the active phase shifter at the second time.

In an example aspect, an apparatus is disclosed. The apparatus includes a wireless transceiver. The wireless transceiver includes at least one power amplifier, at least one low-noise amplifier, and at least one active phase shifter. The active phase shifter is coupled to the power amplifier and the low-noise amplifier.

BRIEF DESCRIPTION OF DRAWINGS

FIG. 6 is a flow diagram illustrating an example process for bi-directional active phase shifting.

DETAILED DESCRIPTION

It may be challenging to design a phase shifter that conserves space within an electronic device without introducing additional losses to the signal processing. Some electronic devices use passive phase shifters, which may be bi-directional. As such, a passive phase shifter can be shared by both a transmit path and a receive path to conserve space within the electronic device. The passive phase shifter, however, can add additional loss within the transmit and receive paths, which degrades signal-to-noise performance of the electronic device.

To address such challenges, techniques for bi-directional active phase shifting are described herein. The described techniques implement an active phase shifter that is bi-directional and disposed in a transmit path and a receive path. The active phase shifter includes a quadrature coupling circuit that enables phase shifting operations to be performed for either transmission or reception. By sharing the quadrature coupling circuit with both the transmit path and the receive path, the active phase shifter occupies less space compared to other designs that have individual active phase shifters disposed in the transmit and receive paths. The active phase shifter can also include variable gain amplifiers, which enable the active phase shifter to achieve higher accuracies relative to some passive phase shifters and to support wideband communications, such as those used for fifth-generation (5G) or millimeter-wave communication modes. Use of the variable gain amplifiers can further conserve space within a wireless transceiver by obviating the use of additional gain buffers used in other wireless transceiver architectures with passive phase shifters.

Figure 1:
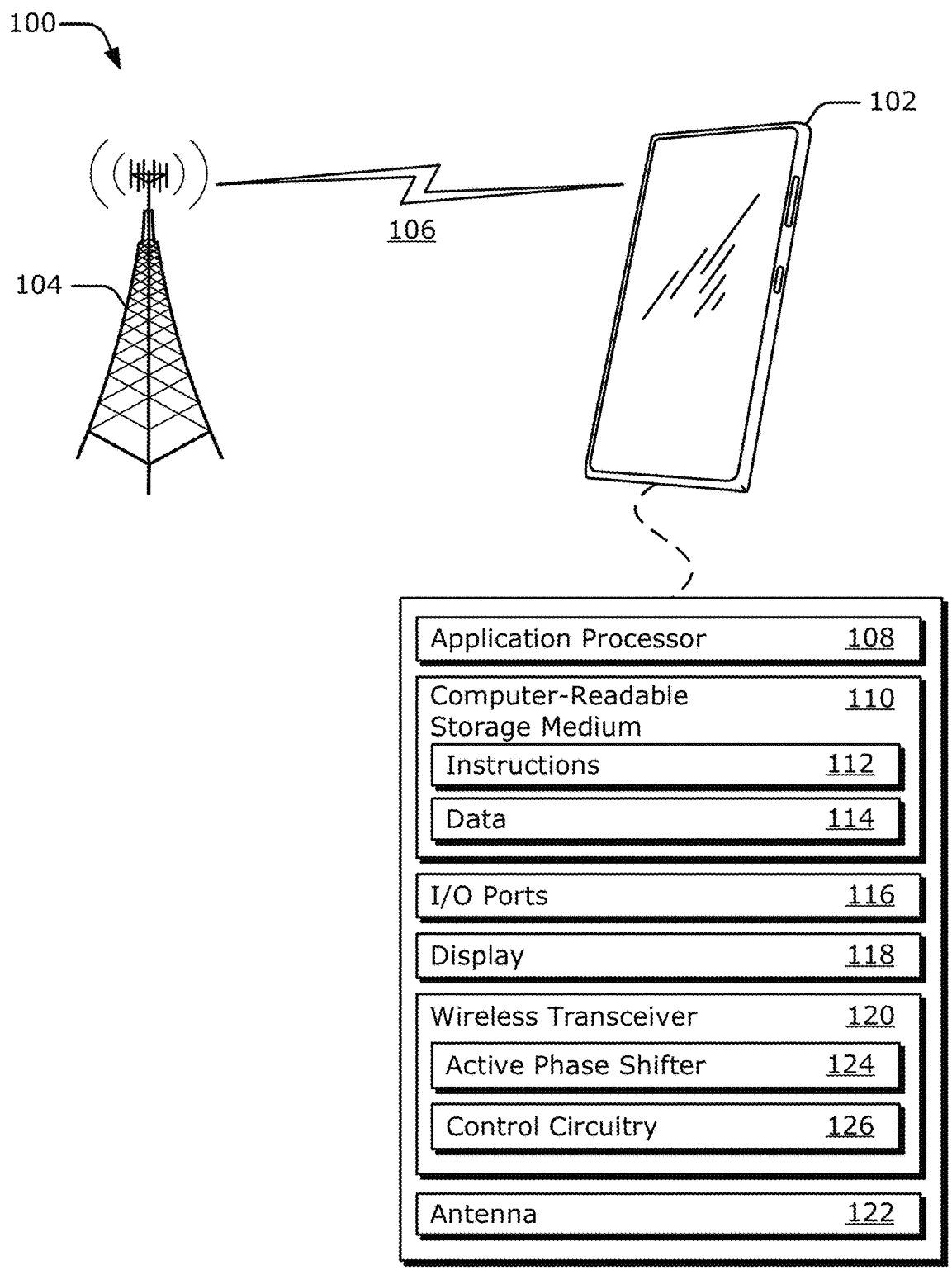
FIG. 1 illustrates an example operating environment for bi-directional active phase shifting.

FIG. 1 illustrates an example environment 100 for bi-directional active phase shifting. In the environment 100, a computing device 102 communicates with a base station 104 through a wireless communication link 106 (wireless link 106). In this example, the computing device 102 is depicted as a smart phone. However, the computing device 102 may be implemented as any suitable computing or electronic device, such as a modem, cellular base station, broadband router, access point, cellular phone, gaming device, navigation device, media device, laptop computer, desktop computer, tablet computer, wearable computer, server, network-attached storage (NAS) device, smart appliance or other internet of things (IoT) device, medical device, vehicle-based communication system, radar, radio apparatus, and so forth.

The base station 104 communicates with the computing device 102 via the wireless link 106, which may be implemented as any suitable type of wireless link. Although depicted as a tower of a cellular network, the base station 104 may represent or be implemented as another device, such as a satellite, server device, terrestrial television broadcast tower, access point, peer-to-peer device, mesh network node, fiber optic line, and so forth. Therefore, the computing device 102 may communicate with the base station 104 or another device via a wired connection, a wireless connection, or a combination thereof.

The wireless link 106 can include a downlink of data or control information communicated from the base station 104 to the computing device 102, or an uplink of other data or control information communicated from the computing device 102 to the base station 104. The wireless link 106 may be implemented using any suitable communication protocol or standard, such as second-generation (2G), third-generation (3G), fourth-generation (4G), fifth-generation (5G), IEEE 802.11 (e.g., Wi-Fi™), IEEE 802.15 (e.g., Bluetooth™), IEEE 802.16 (e.g., WiMAX™), and so forth. In some implementations, the wireless link 106 may wirelessly provide power and the base station 104 may comprise a power source.

As shown, the computing device 102 includes an application processor 108 and a computer-readable storage medium 110 (CRM 110). The application processor 108 may include any type of processor, such as a multi-core processor, that executes processor-executable code stored by the CRM 110. The CRM 110 may include any suitable type of data storage media, such as volatile memory (e.g., random access memory (RAM)), non-volatile memory (e.g., Flash memory), optical media, magnetic media (e.g., disk), and so forth. In the context of this disclosure, the CRM 110 is implemented to store instructions 112, data 114, and other information of the computing device 102, and thus does not include transitory propagating signals or carrier waves.

The computing device 102 may also include input/output ports 116 (I/O ports 116) and a display 118. The I/O ports 116 enable data exchanges or interaction with other devices, networks, or users. The I/O ports 116 may include serial ports (e.g., universal serial bus (USB) ports), parallel ports, audio ports, infrared (IR) ports, user interface ports such as a touchscreen, and so forth. The display 118 presents graphics of the computing device 102, such as a user interface associated with an operating system, program, or application. Alternately or additionally, the display 118 may be implemented as a display port or virtual interface, through which graphical content of the computing device 102 is presented.

A wireless transceiver 120 of the computing device 102 provides connectivity to respective networks and other electronic devices connected therewith. Alternately or additionally, the computing device 102 may include a wired transceiver, such as an Ethernet or fiber optic interface for communicating over a local network, intranet, or the Internet. The wireless transceiver 120 may facilitate communication over any suitable type of wireless network, such as a wireless local area network (LAN) (WLAN), peer-to-peer (P2P) network, mesh network, cellular network, wireless wide-area-network (WWAN), and/or wireless personal-area-network (WPAN). In the context of the example environment 100, the wireless transceiver 120 enables the computing device 102 to communicate with the base station 104 and networks connected therewith. However, the wireless transceiver 120 can also enable the computing device 102 to communicate "directly" with other devices or networks.

The wireless transceiver 120 includes circuitry and logic for transmitting and receiving communication signals via at least one antenna 122. Components of the wireless transceiver 120 can include amplifiers, switches, mixers, analog-to-digital converters, filters, and so forth for conditioning the communication signals (e.g., for generating or processing signals). The wireless transceiver 120 may also include logic to perform in-phase/quadrature (I/Q) operations, such as synthesis, encoding, modulation, decoding, demodulation, and so forth. In some cases, components of the wireless transceiver 120 are implemented as separate receiver and transmitter entities. Additionally or alternatively, the wireless transceiver 120 can be realized using multiple or different sections to implement respective receiving and transmitting operations (e.g., separate transmit and receiver chains). In general, the wireless transceiver 120 processes data and/or signals associated with communicating data of the computing device 102 over the antenna 122.

The wireless transceiver 120 includes at least one active phase shifter 124. In contrast to passive phase shifters, an active phase shifter 124 includes active components, such as transistors or amplifiers, which can provide amplification. In some implementations, the active phase shifter 124 can support wideband (e.g., broadband) operations and can shift phases of signals having frequencies within an extremely-high frequency (EHF) spectrum (e.g., for signals having frequencies between approximately 24 and 44 gigahertz (GHz)). A design of the active phase shifter 124 can realize a particular bit resolution, such as approximately three bits of resolution or more. The active phase shifter 124 is bi-directional and can be disposed in both a transmit path and a receive path of the wireless transceiver 120. Accordingly, the active phase shifter 124 can shift phases of signals that are transmitted or received via the antenna 122. The active phase shifter 124 can at least partially implement bi-directional active phase shifting, as further described with respect to FIGS. 2-5.

The wireless transceiver 120 also includes control circuitry 126, which may be implemented within or separate from the wireless transceiver 120 as a modem, a general-purpose processor, a controller, fixed logic circuitry, hard-coded logic, some combination thereof, and so forth. Components of the control circuitry 126 can be localized at one module or one integrated circuit chip or can be distributed across multiple modules or chips. Although not explicitly shown, the control circuitry 126 can include at least one CRM (e.g., the CRM 110), can include a portion of the CRM 110, or can access the CRM 110 to obtain computer-readable instructions (e.g., instructions 112). The control circuitry 126 controls the wireless transceiver 120 and enables wireless communication to be performed.

In general, the control circuitry 126 can control an operational mode of the wireless transceiver 120 or has knowledge of a current operational mode. Different types of operational modes may include a transmission mode, a reception mode, different spatial coverage modes, different frequency modes (e.g., a high frequency mode or a low frequency mode), different power modes (e.g., a low-power mode or a high-power mode), different resource control states (e.g., a connected mode, an inactive mode, or an idle mode), different modulation modes (e.g., lower-order modulation modes such as quadrature phase-shift keying (QPSK) modes or higher-order modulation modes such as 64 quadrature amplitude modulation (QAM) or 256 QAM), and so forth. To support transmission or reception via a particular antenna 122, the control circuitry 126 enables the corresponding active phase shifter 124 to be appropriately configured. The control circuitry 126 may also specify a relative phase offset between multiple active phase shifters 124 that are coupled to multiple antenna elements of an antenna array to increase transmission power or increase sensitivity along a particular direction.

Figure 2:
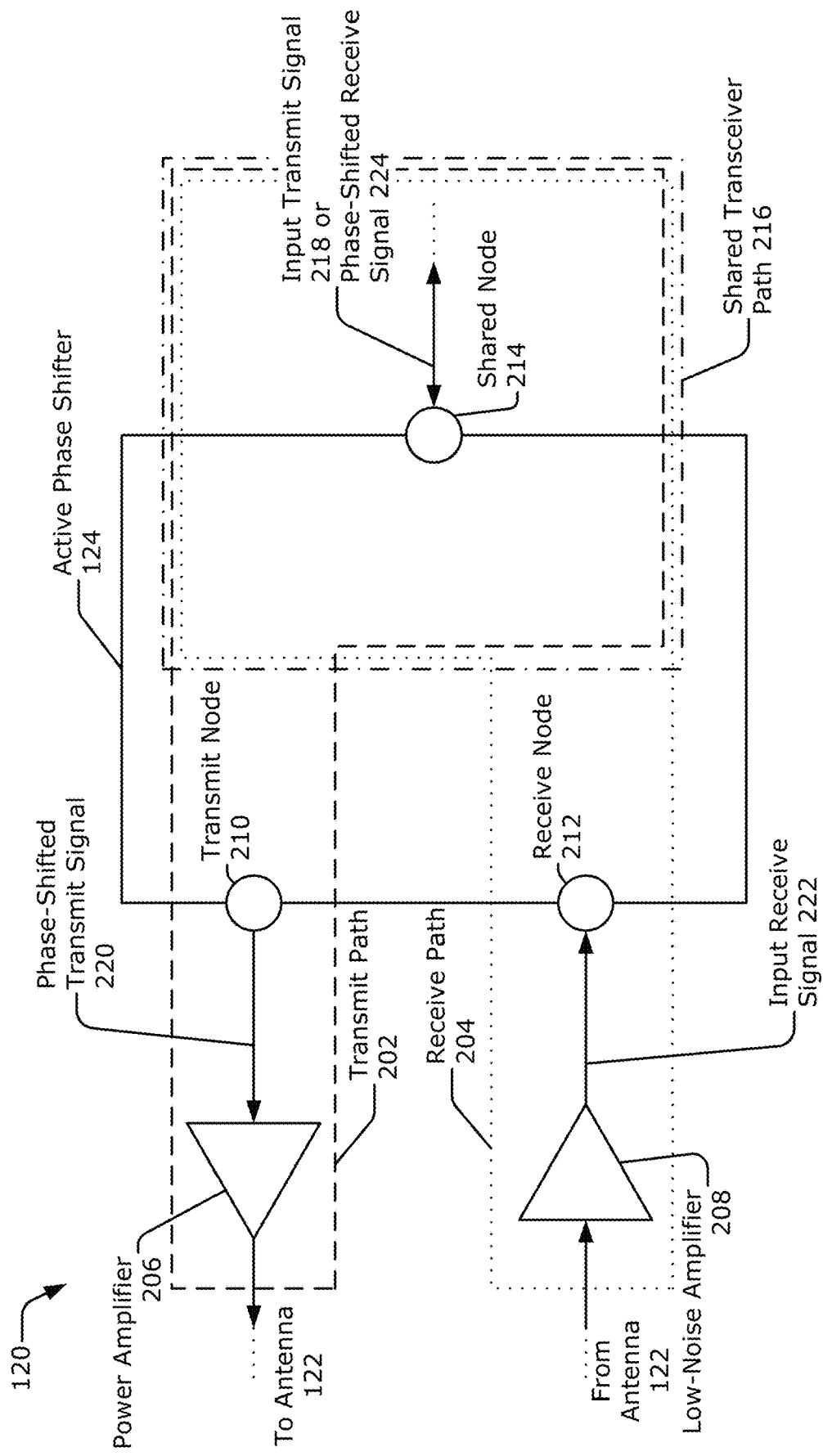
FIG. 2 illustrates an example portion of a wireless transceiver for bi-directional active phase shifting.

FIG. 2 illustrates an example portion of a wireless transceiver 120 for bi-directional active phase shifting. In the depicted configuration, the wireless transceiver 120 includes at least one transmit path 202 and at least one receive path 204. The transmit path 202 and the receive path 204 respectively include a power amplifier 206 and a low-noise amplifier 208. Both the power amplifier 206 and the low-noise amplifier 208 can be coupled to the antenna 122 of FIG. 1.

The active phase shifter 124 is shown to be disposed in both the transmit path 202 and the receive path 204. In other words, the active phase shifter 124 is electrically coupled to other components within the transmit path 202 and the receive path 204, such as the power amplifier 206 and the low-noise amplifier 208. In this way, signals that propagate through the transmit path 202 or the receive path 204 propagate through the active phase shifter 124.

The active phase shifter 124 includes a transmit node 210 disposed in the transmit path 202, a receive node 212 disposed in the receive path 204, and a shared node 214 disposed in both the transmit path 202 and the receive path 204. Although not shown, the shared node 214 may be coupled to other components within the transmit path 202 or the receive path 204, such as a mixer, a combiner, or a splitter. Within a portion of the active phase shifter 124, the transmit path 202 and the receive path 204 share common components along a shared transceiver path 216. This is illustrated with a portion of the dashed lines of the transmit path 202 and a portion of the dotted lines of the receive path 204 being contained within the dotted-dashed lines of the shared transceiver path 216. In this manner, the shared transceiver path 216 represents a common path that is shared by both the transmit path 202 and the receive path 204 (e.g., the shared transceiver path 216 includes at least a portion of both the transmit path 202 and the receive path 204).

During transmission, the active phase shifter 124 accepts an input transmit signal 218 at the shared node 214. Based on the input transmit signal 218 the active phase shifter 124 generates a phase-shifted transmit signal 220 at the transmit node 210. The power amplifier 206 amplifies the phase-shifted transmit signal 220 for transmission via the antenna 122. The phase-shifted transmit signal 220 can have a different phase than the input transmit signal 218. During reception, the low-noise amplifier 208 generates an input receive signal 222, which is accepted at the receive node 212 of the active phase shifter 124. Based on the input receive signal 222, the active phase shifter 124 generates a phase-shifted receive signal 224 at the shared node 214. The phase-shifted receive signal 224 can have a different phase than the input receive signal 222. To perform a beamsteering operation, the computing device 102 includes multiple antennas 122 and multiple phase shifters 124, as shown in FIG. 3.

Figure 3:
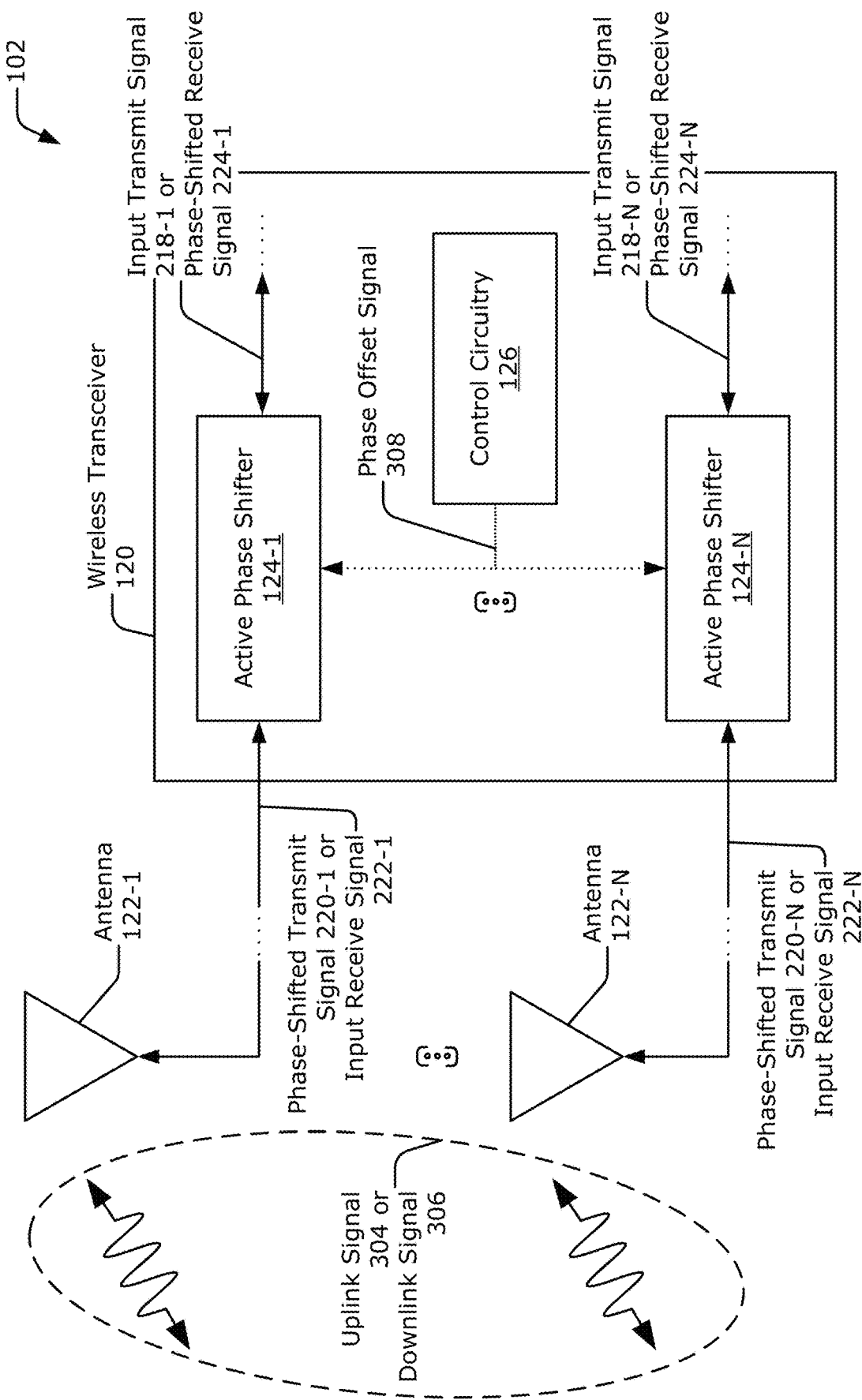
FIG. 3 illustrates an example computing device with multiple antennas and multiple active phase shifters for bi-directional active phase shifting.

FIG. 3 illustrates an example computing device 102 with multiple antennas 122-1 to 122-N and multiple active phase shifters 124-1 to 124-N for bi-directional active phase shifting. In the depicted configuration, N is a positive integer, and a quantity of active phase shifters 124-1 to 124-N equals a quantity of antennas 122-1 to 122-N, but the quantities may differ. In this example, the antennas 122-1 to 122-N implement an antenna array, which transmits and receives signals at different times. The active phase shifters 124-1 to 124-N are respectively coupled to the multiple antennas 122-1 to 122-N and apply relative phase offsets for beamsteering. For simplicity, the transmit path 202, the receive path 204, and the shared transceiver path 216 associated with each of the antennas 122-1 to 122-N are not explicitly depicted.

The control circuitry 126 is coupled to the active phase shifters 124-1 to 124-N and generates a phase offset signal 308. Using the phase offset signal 308, the control circuitry 126 specifies the relative phase offsets that are to be applied by the active phase shifters 124-1 to 124-N for beamsteering. The control circuitry 126 can determine the relative phase offsets based on a target direction that is selected for increasing transmission power or sensitivity. In some cases, the target direction is based on a known direction to the base station 104 of FIG. 1 or a selected direction for communication. The phase offset signal 308 may comprise multiple signals that are sent to respective active phase shifters 124-1 to 124-N or a multi-bit signal with each bit or group of bits respectively controlling the relative phase offset applied by the active phase shifters 124-1 to 124-N.

Using the active phase shifters 124-1 to 124-N and the antennas 122-1 to 122-N, the computing device 102 transmits multiple phase-shifted transmit signals 220-1 to 220-N. In general, the phase-shifted transmit signals 220-1 to 220-N have larger relative phase offsets compared to relative phase offsets of the input transmit signals 218-1 to 218-N. Based on the relative phase offsets of the phase-shifted transmit signals 220-1 to 220-N, an uplink signal 304 is steered in a particular direction. Additionally, the active phase shifters 124-1 to 124-N and the antennas 122-1 to 122-N increase a sensitivity of the wireless transceiver 120 for receiving a downlink signal 306 from a particular direction. In this case, relative phases of the input receive signals 222-1 to 222-N may differ due to differences in locations of the antennas 122-1 and 122-N and the direction of the downlink signal 306. The active phase shifters 124-1 to 124-N can compensate for these relative phase differences by generating the phase-shifted receive signals 224-1 to 224-N with substantially similar phases. In other words, the phase-shifted receive signals 224-1 to 224-N generally have smaller relative phase offsets compared to relative phase offsets of the input receive signals 222-1 to 222-N. In this way, the phase-shifted receive signals 224-1 to 224-N can be combined by the wireless transceiver 120 to increase sensitivity. By performing phase shifting within the transmit path 202 or receive path 204 (as shown in FIG. 2), the computing device 102 can communicate with other devices at farther distances.

Figure 4:
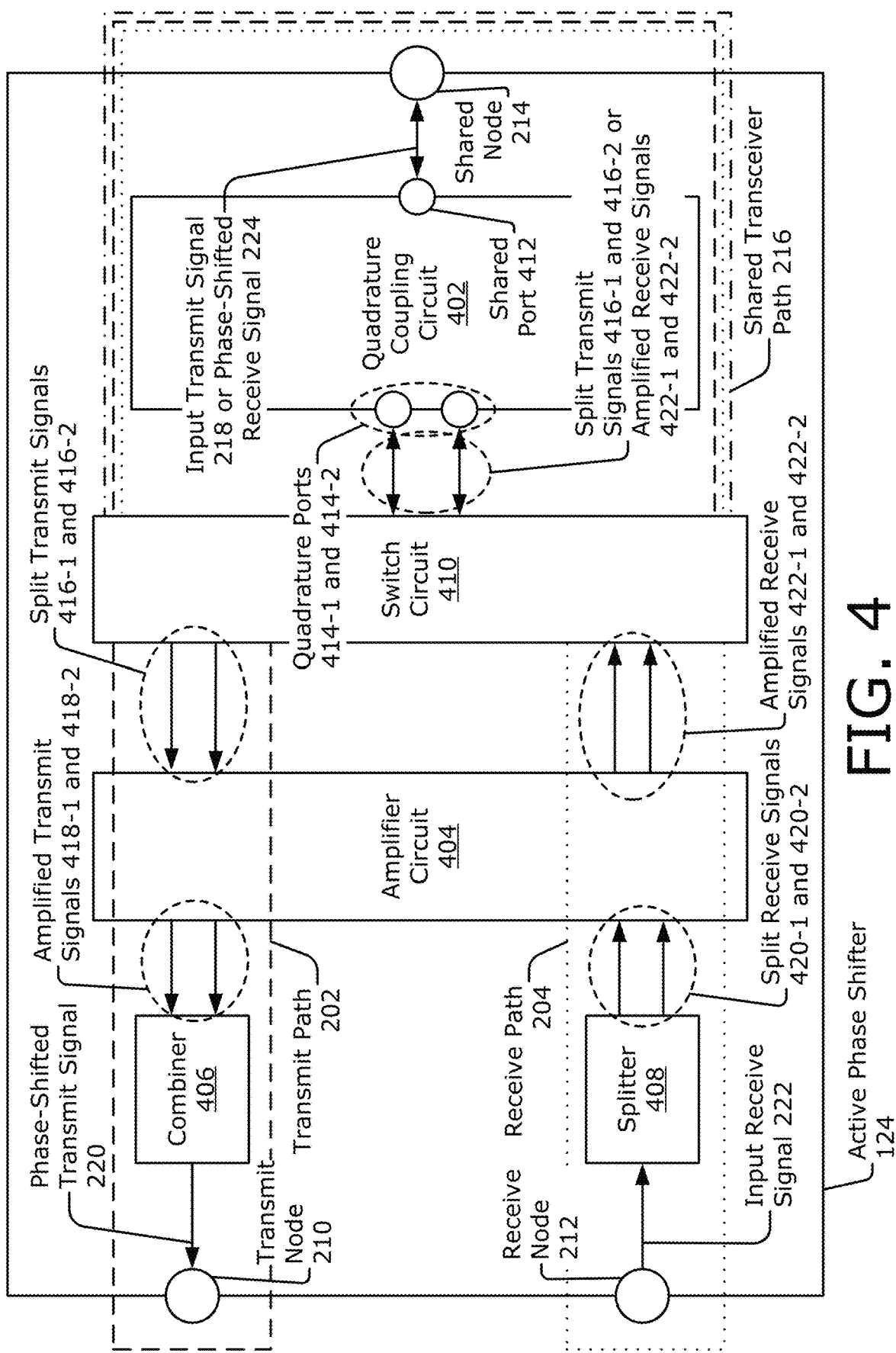
FIG. 4 illustrates an example implementation of an active phase shifter for bi-directional active phase shifting.
Figure 5:
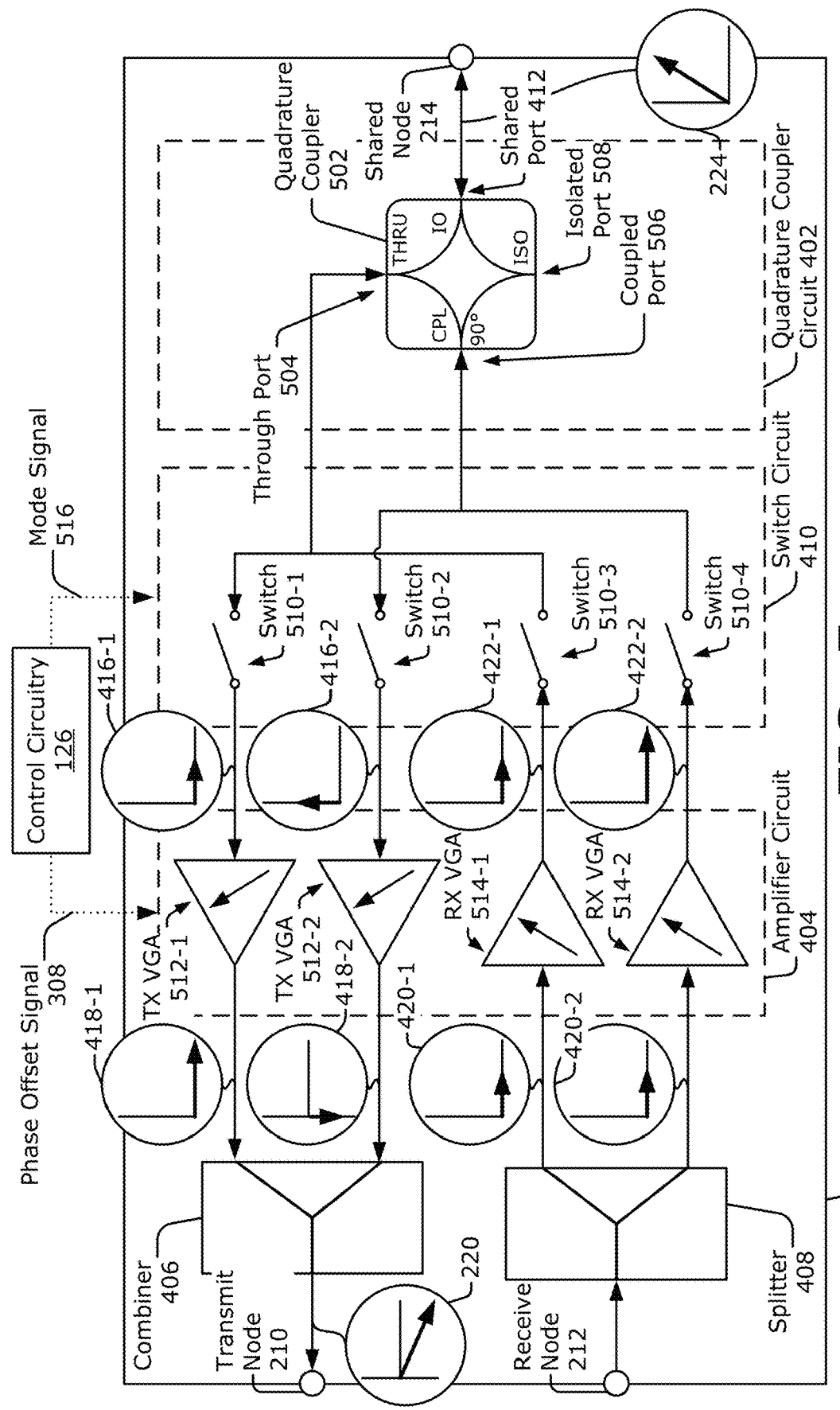
FIG. 5 illustrates another example implementation of an active phase shifter for bi-directional active phase shifting.

Example implementations of the active phase shifter 124 are further described with respect to FIGS. 4 and 5.

FIG. 4 illustrates an example active phase shifter 124 for bi-directional active phase shifting. In the depicted configuration, the active phase shifter 124 includes a quadrature coupling circuit 402, an amplifier circuit 404, a combiner 406, and a splitter 408. The active phase shifter 124 may also include a switch circuit 410, which is coupled between the quadrature coupling circuit 402 and the amplifier circuit 404.

As illustrated in FIG. 4, the active phase shifter 124 includes components that are disposed along the transmit path 202, components that are disposed along the receive path 204, and components that are disposed along the shared transceiver path 216 (e.g., components that are shared by both the transmit path 202 and the receive path 204). In particular, the combiner 406 and a portion of the amplifier circuit 404 are included within the transmit path 202. Additionally, the receive path 204 includes the splitter 408 and another portion of the amplifier circuit 404. The switch circuit 410 provides an interface that merges the transmit path 202 and the receive path 204 into the shared transceiver path 216. In some cases, the switch circuit 410 may include components that are individually or separately disposed in the transmit path 202 or the receive path 204 or components that are disposed in both the transmit path 202 and the receive path 204. The shared transceiver path 216 includes the quadrature coupling circuit 402, which is included within both the transmit path 202 and the receive path 204. In this way, the active phase shifter 124 occupies less space compared to other wireless transceivers that utilize separate active phase shifters (e.g., and therefore separate quadrature coupling circuits 402) within the transmit path 202 and the receive path 204.

The quadrature coupling circuit 402 includes a shared port 412, which is coupled to the shared node 214, and two quadrature ports 414-1 and 414-2. In some implementations the quadrature coupling circuit 402 is implemented using a quadrature coupler (e.g., a three-decibel (3 dB) ninety-degree hybrid coupler). In other implementations, the quadrature coupling circuit 402 includes coupling components that provide an approximately ninety-degree phase shift between one of the quadrature ports 414-1 and 414-2 and the shared port 412 and provide an approximately zero-degree phase shift between another of the quadrature ports 414-1 and 414-2 and the shared port 412.

In example operations for transmission, the quadrature coupling circuit 402 accepts a signal at the shared port 412 and splits the accepted signal into two signals, which are respectively provided at the quadrature ports 414-1 and 414-2. Depending on a design of the quadrature coupling circuit 402, the multiple signals can have relatively similar amplitudes or relatively different amplitudes, and can have a relative phase offset of approximately ninety degrees with respect to one another. In example operations for reception, the quadrature coupling circuit 402 shifts the phase of one of the signals that is accepted at one of the quadrature ports 414-1 or 414-2 by approximately ninety degrees and combines this phase-shifted signal with another signal that is accepted at the other quadrature port 414-1 or 414-2. The combined signal is generated at the shared port 412.

The combiner 406 and the splitter 408 are respectively coupled to the transmit node 210 and the receive node 212. In contrast to the quadrature coupling circuit 402, the combiner 406 and the splitter 408 substantially maintain a relative phase offset between signals that are accepted or generated, respectively. In other words, the combiner 406 combines multiple signals without substantially shifting a phase of one of the accepted signals and the splitter 408 generates multiple signals that are approximately in-phase with respect to each other. Types of components that may implement the combiner 406 or the splitter 408 include a Wilkinson circuit (e.g., a Wilkinson combiner or splitter), a T-junction, a transformer, a current summing node, a matching network, and so forth. In an example implementation of the combiner 406 using a current summing node, outputs of the amplifier circuit 404 that are coupled to the combiner 406 may be current mode outputs from transistors within the amplifier circuit 404, and the combiner 406 provides the load impedance to each output of the amplifier circuit 404. In an example implementation of the splitter 408 using a matching network, inputs to the amplifier circuit 404 coming from the splitter 408 may have an impedance Z1, and the splitter 408 provides impedance transformation from Z1 to Z2*2 so that two amplifiers within the amplifier circuit 404 provide a combined impedance Z2 through the splitter 408 to the receive node 212. The impedance Z2 can be matched to tan output impedance of the low noise amplifier 208 that is coupled to receive node 212.

The amplifier circuit 404 is coupled between the quadrature coupling circuit 402, the combiner 406, and the splitter 408. The amplifier circuit 404 adjusts amplitudes of signals that are provided by the quadrature coupling circuit 402 for transmission operations or by the splitter 408 for reception operations. In some implementations, the amplifier circuit 404 includes at least four variable gain amplifiers, which can be implemented using active components, such as transistors. Respective gains of the four variable gain amplifiers can be individually controlled by the control circuitry 126 via the phase offset signal 308 of FIG. 3. Using the variable gain amplifiers, the amplifier circuit 404 can individually adjust respective amplitudes of the signals by increasing, decreasing, or inverting the amplitudes. In other cases, the variable gain amplifiers can maintain the amplitudes of the signals such that the amplitudes are relatively unchanged by the variable gain amplifiers. As further described with respect to FIG. 5, at least two (e.g., a pair) of the transmit variable gain amplifiers are disposed in the transmit path 202 and at least two (e.g., a pair) of the receive variable gain amplifiers are disposed in the receive path 204.

The switch circuit 410 is coupled between the quadrature coupling circuit 402 and the amplifier circuit 404. The switch circuit 410 may include at least one switch or at least one multiplexer. The control circuitry 126 controls an operational state of the switch circuit 410, as is shown in FIG. 5. During transmission, the switch circuit 410 is in a transmit state that connects the quadrature ports 414-1 and 414-2 of the quadrature coupling circuit 402 to a portion of the amplifier circuit 404 that is disposed in the transmit path 202 (e.g., to the transmit variable gain amplifiers) and disconnects the quadrature ports 414-1 and 414-2 from the other portion of the amplifier circuit 404 that is disposed in the receive path 204. During reception, the switch circuit 410 is in a receive state that connects the quadrature ports 414-1 and 414-2 to a portion of the amplifier circuit 404 that is disposed in the receive path 204 (e.g., to the receive variable gain amplifiers) and disconnects the quadrature ports 414-1 and 414-2 from the other portion of the amplifier circuit 404 that is disposed in the transmit path 202. Although the switch circuit 410 and the quadrature coupling circuit 402 may add some loss to the transmit path 202 and the receive path 204, having the switch circuit 410 and the quadrature coupling circuit 402 implemented before the amplifier circuit 404 and the power amplifier 206 (of FIG. 2) within the transmit path 202 and after the low-noise amplifier 208 (of FIG. 2) and the amplifier circuit 404 within the receive path 204 provides improved linearity in the transmit mode and improved noise figure performance in the receive mode of the wireless transceiver 120.

During transmission, the quadrature coupling circuit 402 splits the input transmit signal 218 to generate split transmit signals 416-1 and 416-2. The split transmit signals 416-1 and 416-2 are approximately ninety degrees out-of-phase with respect to each other. The control circuitry 126 (of FIG. 3) causes the switch circuit 410 to be in the transmit state to pass the split transmit signals 416-1 and 416-2 to the portion of the amplifier circuit 404 associated with the transmit path 202. The amplifier circuit 404 adjusts the amplitudes of the split transmit signals 416-1 and 416-2 to generate amplified transmit signals 418-1 and 418-2. The combiner 406 combines the amplified transmit signals 418-1 and 418-2 to generate the phase-shifted transmit signal 220 at the transmit node 210. In this manner, a phase of the phase-shifted transmit signal 220 is based on a relative amplitude difference between the amplified transmit signals 418-1 and 418-2 and the ninety-degree phase offset between the amplified transmit signals 418-1 and 418-2, which was applied via the quadrature coupling circuit 402.

During reception, the splitter 408 splits the input receive signal 222 to generate the split receive signals 420-1 and 420-2. The split receive signals 420-1 and 420-2 are substantially in-phase with each other (e.g., have relatively similar phases). The amplifier circuit 404 adjusts the amplitudes the split receive signals 420-1 and 420-2 to generate the amplified receive signals 422-1 and 422-2. The control circuitry 126 causes the switch circuit 410 to be in the receive state to pass the amplified receive signals 422-1 and 422-2 to the quadrature coupling circuit 402. The quadrature coupling circuit 402 generates the phase-shifted receive signal 224 at the shared node 214 based on the amplified receive signals 422-1 and 422-2. In this manner, a phase of the phase-shifted receive signal 224 is based on a relative amplitude difference between the amplified receive signals 422-1 and 422-2 and the ninety-degree phase offset that is applied via the quadrature coupling circuit 402. As shown above, the active phase shifter 124 performs phase shifting for both transmission and reception, and is therefore bi-directional.

FIG. 5 illustrates another example implementation of the active phase shifter 124 for bi-directional active phase shifting. In the depicted configuration, the quadrature coupler circuit 402 includes a quadrature coupler 502 with the shared port 412 (e.g., an input or output (IO) port), a through port 504, a coupled port 506, and an isolated port 508. A signal that passes between the shared port 412 and the through port 504 has a phase that remains relatively unchanged while another signal that passes between the shared port 412 and the coupled port 506 has a phase that is shifted by approximately ninety degrees. The through port 504 and the coupled port 506 correspond respectively to the quadrature ports 414-1 and 414-2 of FIG. 4.

The switch circuit 410 includes four switches 510-1 to 510-4. The amplifier circuit 404 includes four variable gain amplifiers (VGAs), which comprise transmit variable gain amplifiers 512-1 and 512-2 and receive variable gain amplifiers 514-1 and 514-2. The switches 510-1 and 510-2 respectively couple the transmit variable gain amplifiers 512-1 and 512-2 to the through port 504 and the coupled port 506. Likewise, the switches 510-3 and 510-4 respectively couple the receive variable gain amplifiers 514-1 and 514-2 to the through port 504 and the coupled port 506.

In addition to being coupled to the amplifier circuit 404 (as shown in FIG. 5) and generating the phase offset signal 308, the control circuitry 126 is coupled to the switch circuit 410 and generates a mode signal 516. The mode signal 516 controls the operational state of the switch circuit 410 (e.g., whether the switch circuit 410 is in the transmit state or the receive state) by controlling operational states of the switches 510-1 to 510-4. During transmission, the mode signal 516 causes the switches 510-1 and 510-2 to be in a closed state and the switches 510-3 and 510-4 to be in an open state. During reception, the mode signal 516 causes the switches 510-1 and 510-2 to be in the open state and the switches 510-3 and 510-4 to be in the closed state.

Example vector diagrams of the signals that are generated via the active phase shifter 124 are also shown in FIG. 5. During transmission, the quadrature coupler 502 generates the split transmit signals 416-1 and 416-2 at the through port 504 and the coupled port 506, respectively. Due to the phase shift that occurs between the shared port 412 and the coupled port 506, the split transmit signal 416-2 has a phase that differs from a phase of the split transmit signal 416-1 by approximately ninety degrees. The switch circuit 410 passes the split transmit signals 416-1 and 416-2 to the transmit variable gain amplifiers 512-1 and 512-2.

In this example, the transmit variable gain amplifier 512-1 increases an amplitude of the split transmit signal 416-1 to generate the amplified transmit signal 418-1, and the transmit variable gain amplifier 512-2 decreases and inverts an amplitude of the split transmit signal 416-2 to generate the amplified transmit signal 418-2. These adjustments to the amplitudes of the split transmit signals 416-1 and 416-2 can be specified by the control circuitry 126 via the phase offset signal 308 to effectively shift a phase of the input transmit signal 218 by a target amount. The combiner 406 combines the amplified transmit signals 418-1 and 418-2 to generate the phase-shifted transmit signal 220, which is shown to be a vector summation of the amplified transmit signals 418-1 and 418-2.

During reception, the splitter 408 generates the split receive signals 420-1 and 420-2, which are substantially in-phase with each other. In this example, the receive variable gain amplifier 514-1 generates the amplified receive signal 422-1 such that the amplified receive signal 422-1 has a relatively similar amplitude as the split receive signal 420-1 (e.g., a gain of the receive variable gain amplifier 514-1 is approximately zero dB). In contrast, the receive variable gain amplifier 514-2 generates the amplified receive signal 422-2 with a larger amplitude than the split receive signal 420-2. These adjustments or lack of adjustments to the amplitudes of the split transmit signals 416-1 and 416-2 can be specified by the control circuitry 126 via the phase offset signal 308 to effectively shift a phase of the input receive signal 222 by a target amount.

The switch circuit 410 passes the amplified receive signals 422-1 and 422-2 to the through port 504 and the coupled port 506 of the quadrature coupler 502, respectively. Because the amplified receive signal 422-2 is accepted at the coupled port 506, the quadrature coupler 502 shifts a phase of the amplified receive signal 422-2 by approximately ninety degrees to produce a phase-shifted amplified receive signal 422-2 (not explicitly shown). At the shared port 412, the quadrature coupler 502 combines the amplified receive signal 422-1 with the phase-shifted amplified receive signal 422-2 to generate the phase-shifted receive signal 224, which is shown to be a vector summation of these signals. Although single-ended circuits are shown in FIGS. 4 and 5 for simplicity, other implementations of the active phase shifter 124 may comprise differential circuits.

FIG. 6 is a flow diagram illustrating an example process 600 for bi-directional active phase shifting. The process 600 is described in the form of a set of blocks 602-608 that specify operations that can be performed. However, operations are not necessarily limited to the order shown in FIG. 6 or described herein, for the operations may be implemented in alternative orders or in fully or partially overlapping manners. Operations represented by the illustrated blocks of the process 600 may be performed by a wireless transceiver 120 (e.g., of FIG. 1 or 2). More specifically, the operations of the process 600 may be performed by an active phase shifter 124 as shown in FIGS. 1-5.

At block 602, an input transmit signal is accepted at a shared node of an active phase shifter at a first time. For example, the active phase shifter 124 accepts the input transmit signal 218 at the shared node 214 at the first time, as shown in FIG. 2. The input transmit signal 218 may be provided by other components of a transmit chain of the wireless transceiver 120, such as a splitter, a mixer, an amplifier, a filter, and so forth.

At block 604, a phase-shifted transmit signal is generated at a transmit node of the active phase shifter at the first time. The phase-shifted transmit signal is based on the input transmit signal. For example, the active phase shifter 124 generates, based on the input transmit signal 218, the phase-shifted transmit signal 220 at the transmit node 210, as shown in FIG. 2. The phase-shifted transmit signal 220 can have a different phase relative to the input transmit signal 218. To generate the phase-shifted transmit signal 220, the active phase shifter 124 can include the quadrature coupling circuit 402, the amplifier circuit 404, and the combiner 406 shown in FIG. 4. In an example operation, the quadrature coupling circuit 402 splits the input transmit signal 218 to generate two split transmit signals 416-1 and 416-2. The amplifier circuit 404 adjusts respective amplitudes of the two split transmit signals 416-1 and 416-2 to generate two amplified transmit signals 418-1 and 418-2. The combiner 406 combines the two amplified transmit signals 418-1 and 418-2 to generate the phase-shifted transmit signal 220. The phase-shifted transmit signal 220 can be amplified by the power amplifier 206 and transmitted via the antenna 122. By controlling a phase of the phase-shifted transmit signal 220 relative to other phase-shifted transmit signals transmitted via other antennas, the wireless transceiver 120 can steer the uplink signal 304 and increase transmission power along a direction to the base station 104.

At block 606, an input receive signal is accepted at a receive node of the active phase shifter at a second time. For example, the active phase shifter 124 accepts the input receive signal 222 at the receive node 212. The input receive signal 222 is based on a portion of the downlink signal 306, which is received via the antenna 122 and amplified by the low-noise amplifier 208 of FIG. 2. The first time and the second time can correspond to different time slots associated with time division duplexing.

At block 608, a phase-shifted receive signal is generated at the shared node of the active phase shifter at the second time. The phase-shifted receive signal is based on the input receive signal. For example, the active phase shifter 124 generates, based on the input receive signal 222, the phase-shifted receive signal 224 at the shared node 214 at the second time. The phase-shifted receive signal 224 can have a different phase relative to the input receive signal 222. To generate the phase-shifted receive signal 224, the active phase shifter 124 also includes the splitter 408, which splits the input receive signal 222 to generate the two split receive signals 420-1 and 420-2. The amplifier circuit 404 adjusts respective amplitudes of the two split receive signals 420-1 and 420-2 to generate two amplified receive signals 422-1 and 422-2. The quadrature coupling circuit 402 combines the two amplified receive signals 422-1 and 422-2 to generate the phase-shifted receive signal 224. As described above, the active phase shifter 124 is bi-directional because it can provide phase shifting for the transmit path 202 or the receive path 204, or both the transmit path 202 and the receive path 204 at different times. By controlling a phase of the phase-shifted receive signal 224 relative to other phase-shifted receive signals generated via other active phase shifters, the wireless transceiver 120 can realize increased sensitivity along a direction to the base station 104 for receiving the downlink signal 306. The phase-shifted receive signal 224 can be provided to other components of a receive chain of the wireless transceiver 120, such as a combiner, a mixer, an amplifier, a filter, and so forth.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Further, items represented in the accompanying figures and terms discussed herein may be indicative of one or more items or terms, and thus reference may be made interchangeably to single or plural forms of the items and terms in this written description. Finally, although subject matter has been described in language specific to structural features or methodological operations, it is to be understood that the subject matter defined in the appended claims is not necessarily limited to the specific features or operations described above, including not necessarily being limited to the organizations in which features are arranged or the orders in which operations are performed.

What is claimed is:

1. An apparatus comprising:
    a wireless transceiver including:
        at least one transmit path;
        at least one receive path; and
        at least one active phase shifter disposed in the transmit path and the receive path, the active phase shifter configured to:
            accept a transmit signal from a component disposed in the transmit path; and
            accept a receive signal from a component disposed in the receive path.

2. The apparatus of claim 1, wherein the active phase shifter includes:
    a quadrature coupling circuit disposed in the transmit path and the receive path; and
    an amplifier circuit, a portion of the amplifier circuit disposed in the transmit path and another portion of the amplifier circuit disposed in the receive path.

3. The apparatus of claim 2, wherein:
    the quadrature coupling circuit includes a quadrature coupler; and
    the amplifier circuit includes:
        two transmit variable gain amplifiers disposed in the transmit path; and
        two receive variable gain amplifiers disposed in the receive path.

4. The apparatus of claim 3, wherein:
    the active phase shifter includes a shared node;

the quadrature coupler includes a shared port and two quadrature ports, the shared port coupled to the shared node;

the two transmit variable gain amplifiers are selectively coupled to the two quadrature ports of the quadrature coupler, respectively; and the two receive variable gain amplifiers are selectively coupled to the two quadrature ports of the quadrature coupler, respectively.

5. The apparatus of claim 4, wherein:
the active phase shifter includes a switch circuit coupled between:
the two quadrature ports of the quadrature coupler and the two transmit variable gain amplifiers; and
the two quadrature ports of the quadrature coupler and the two receive variable gain amplifiers; and
the switch circuit is configured to selectively be in:
a transmit state that connects the two transmit variable gain amplifiers to the two quadrature ports and disconnects the two receive variable gain amplifiers from the two quadrature ports; or
a receive state that connects the two receive variable gain amplifiers to the two quadrature ports and disconnects the two transmit variable gain amplifiers from the two quadrature ports.

6. The apparatus of claim 2, wherein the active phase shifter includes:
a transmit node and a receive node;
a combiner disposed in the transmit path, the combiner coupled between the transmit node and the amplifier circuit; and
a splitter disposed in the receive path, the splitter coupled between the receive node and the amplifier circuit.

7. The apparatus of claim 6, wherein the combiner and the splitter each comprise one of the following:
a Wilkinson circuit;
a T-junction;
a transformer;
a current summing node; or
a matching network.

8. The apparatus of claim 6, wherein:
the transmit path includes another component coupled to the transmit node of the active phase shifter;
the component of the receive path is coupled to the receive node of the active phase shifter; and
the active phase shifter is electrically coupled to the other component of the transmit path at the transmit node and is electrically coupled to the component of the receive path at the receive node.

9. The apparatus of claim 8, wherein:
the other component of the transmit path includes a power amplifier; and
the component of the receive path includes a low-noise amplifier.

10. The apparatus of claim 9, further comprising an antenna, the antenna coupled to the power amplifier and the low-noise amplifier.

11. The apparatus of claim 10, further comprising another antenna, wherein the wireless transceiver includes:
another transmit path coupled to the other antenna;
another receive path coupled to the other antenna; and
another active phase shifter disposed in the other transmit path and the other receive path.

12. The apparatus of claim 11, wherein:
the antenna and the other antenna are configured to transmit phase-shifted transmit signals; and
the active phase shifter and the other active phase shifter are jointly configured to generate the phase-shifted transmit signals, the phase-shifted transmit signals having a relative phase offset with respect to one another.

13. The apparatus of claim 11, wherein:
the antenna and the other antenna are configured to receive respective input receive signals having a relative phase offset with respect to one another; and
the active phase shifter and the other active phase shifter are jointly configured to generate phase-shifted receive signals based on the respective input receive signals, the phase-shifted receive signals having a smaller relative phase offset compared to the relative phase offset of the respective input receive signals.

14. An apparatus comprising:
a wireless transceiver including:
at least one transmit path configured to propagate a transmit signal;
at least one receive path configured to propagate a receive signal; and
active means for phase shifting the transmit signal and the receive signal, the active means disposed in the transmit path and the receive path.

15. The apparatus of claim 14, wherein:
the transmit path includes a component configured to provide the transmit signal as an input transmit signal to the active means;
the receive path includes a component configured to provide the receive signal as an input receive signal to the active means; and
the active means comprises:
quadrature coupler means for generating split transmit signals based on the input transmit signal at a first time and for combining amplified receive signals to generate a phase-shifted receive signal at a second time; and
amplifier means for adjusting respective amplitudes of the split transmit signals at the first time to generate amplified transmit signals and for generating the amplified receive signals based on split receive signals at the second time, the split receive signals derived from the input receive signal.

16. The apparatus of claim 15, wherein the amplifier means comprises:
variable-gain transmit means for amplifying the split transmit signals at the first time to generate the amplified transmit signals; and
variable-gain receive means for amplifying the split receive signals to generate the amplified receive signals at the second time.

17. The apparatus of claim 16, wherein the active means includes switch means for connecting the variable-gain transmit means to the quadrature coupler means at the first time and for connecting the variable-gain receive means to the quadrature coupler means at the second time.

18. The apparatus of claim 15, wherein the active means comprises:
combiner means for generating a phase-shifted transmit signal based on the amplified transmit signals at the first time; and
splitter means for generating the split receive signals based on the input receive signal at the second time.

19. The apparatus of claim 18, wherein:
the combiner means is configured to generate the phase-shifted transmit signal while substantially maintaining a relative phase offset of the amplified transmit signals; and the splitter means is configured to generate the split receive signals such that the split receive signals are substantially in-phase with respect to one another.

20. The apparatus of claim 18, wherein:
the transmit path includes a power amplifier coupled to the combiner means; and
the component of the receive path includes a low-noise amplifier coupled to the splitter means.

21. An apparatus comprising:
a wireless transceiver including:
at least one power amplifier;
at least one low-noise amplifier; and
at least one active phase shifter comprising:
a transmit node coupled to the power amplifier; and
a receive node coupled to the low-noise amplifier.

22. The apparatus of claim 21, wherein the active phase shifter includes:
a combiner coupled to the transmit node; and
a splitter coupled to the receive node.

23. The apparatus of claim 22, wherein the active phase shifter includes:
two transmit variable gain amplifiers coupled to the combiner;
two receive variable gain amplifiers coupled to the splitter; and
a quadrature coupler circuit coupled to the two transmit variable gain amplifiers and the two receive variable gain amplifiers.

24. The apparatus of claim 21, wherein:
the power amplifier is configured to amplify a phase-shifted transmit signal at a first time;
the low-noise amplifier is configured to generate an input receive signal at a second time; and
the active phase shifter is configured to:
accept an input transmit signal at the first time;
generate the phase-shifted transmit signal based on the input transmit signal at the first time, the phase-shifted transmit signal having a different phase than the input transmit signal;
accept the input receive signal at the second time; and
generate a phase-shifted receive signal based on the input receive signal at the second time, the phase-shifted receive signal having a different phase than the input receive signal.

25. The apparatus of claim 23, wherein:
the active phase shifter includes a shared node;
the quadrature coupler circuit includes a shared port and two quadrature ports, the shared port coupled to the shared node;

two transmit variable gain amplifiers of the two transmit variable gain amplifiers are selectively coupled to the two quadrature ports of the quadrature coupler circuit, respectively; and
two receive variable gain amplifiers of the two receive variable gain amplifiers are selectively coupled to the two quadrature ports of the quadrature coupler circuit, respectively.

26. The apparatus of claim 25, wherein:
the active phase shifter includes a switch circuit coupled between:
the two quadrature ports of the quadrature coupler circuit and the two transmit variable gain amplifiers; and
the two quadrature ports of the quadrature coupler circuit and the two receive variable gain amplifiers; and
the switch circuit is configured to selectively be in:
a transmit state that connects the two transmit variable gain amplifiers to the two quadrature ports and disconnects the two receive variable gain amplifiers from the two quadrature ports; or
a receive state that connects the two receive variable gain amplifiers to the two quadrature ports and disconnects the two transmit variable gain amplifiers from the two quadrature ports.

27. The apparatus of claim 22, wherein the combiner and the splitter each comprise one of the following:
a Wilkinson circuit;
a T-junction;
a transformer;
a current summing node; or
a matching network.

28. The apparatus of claim 21, further comprising an antenna, the antenna coupled to the power amplifier and the low-noise amplifier.

29. The apparatus of claim 21, wherein:
the wireless transceiver comprises:
a transmit path comprising the power amplifier; and
a receive path comprising the low-noise amplifier; and
the active phase shifter comprises a component disposed in the transmit path and the receive path.

30. The apparatus of claim 21, wherein the active phase shifter comprises a component configured to provide amplification.

* * * * *